(12) United States Patent
Aokura et al.

(10) Patent No.: US 6,342,139 B1
(45) Date of Patent: Jan. 29, 2002

(54) SPUTTERING SYSTEM

(75) Inventors: Isamu Aokura, Osaka; Tomohiro Okumura, Kadoma; Naoki Suzuki, Neyagawa, all of (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/495,293

(22) Filed: Feb. 1, 2000

(30) Foreign Application Priority Data

Feb. 2, 1999 (JP) .......................................... 11-025157

(51) Int. Cl.[7] .......................... C23C 14/35; C23C 14/34
(52) U.S. Cl. .......................... 204/298.06; 204/298.08; 204/298.16; 204/298.11; 204/298.19
(58) Field of Search ...................... 204/298.06, 298.08, 204/298.11, 298.16, 298.19

(56) References Cited

U.S. PATENT DOCUMENTS

| | | | | |
|---|---|---|---|---|
| 4,622,121 A | * | 11/1986 | Wegmann et al. | 204/298.19 |
| 4,990,229 A | * | 2/1991 | Campbell et al. | 204/298.06 |
| 5,431,799 A | * | 7/1995 | Mosely et al. | 204/298.06 |
| 5,531,877 A | * | 7/1996 | Latz et al. | 204/298.19 |
| 5,800,688 A | * | 9/1998 | Lantsmann et al. | 204/298.06 |
| 6,080,287 A | * | 6/2000 | Drewery et al. | 204/192.15 |

FOREIGN PATENT DOCUMENTS

JP 6-41739 2/1994

* cited by examiner

*Primary Examiner*—Mark F. Huff
*Assistant Examiner*—Daborah Chacko-Davis
(74) *Attorney, Agent, or Firm*—Wenderoth, Lind & Ponack, L.L.P.

(57) ABSTRACT

A sputtering system includes a vacuum chamber, a sputtering electrode provided in the vacuum chamber, a target supported on the sputtering electrode with a front surface of the target and a substrate disposed in the vacuum chamber so as to be opposed to each other. A high-frequency or DC power source supplies a high-frequency or DC power to the sputtering electrode to generate plasma on the target, and an antenna is provided for generating an electromagnetic wave and is disposed outside the vacuum chamber and near the target. An electromagnetic-wave inlet window for introducing into the vacuum chamber an electromagnetic wave generated from the antenna is provided in a wall of the vacuum chamber.

18 Claims, 12 Drawing Sheets

SPUTTERING SYSTEM

BACKGROUND OF THE INVENTION

The present invention relates to a sputtering system which is a kind of thin film deposition system.

The sputtering system is a system for depositing a thin film by a method comprising generating plasma by producing gas discharge generally in a low vacuum atmosphere and making cations of the plasma collide against a target set on a negative electrode that is called a sputtering electrode, so that particles sputtered by the collision are deposited onto the substrate. This sputtering system, in which the control of thin film composition and the operation of the system are relatively easy, has been used widely for a film deposition process.

FIG. 7 shows the construction of a conventional magnetron sputtering system. Referring to FIG. 7, reference numeral 101 denotes a vacuum vessel, 102 denotes an evacuation port, through which evacuation is made by a vacuum pump (not shown), and 103 denotes a movable valve, which allows evacuation conductance to be controlled. The object denoted by numeral 104 is a main valve.

Numeral 105 denotes a gas inlet tube directed toward the inside of the vacuum vessel 101, and 106 denotes a gas flow rate controller attached to the gas inlet tube 105. Numeral 107 denotes discharge gas, which is introduced into the vacuum vessel 101 through the gas inlet tube 105, and argon gas is normally used. Numeral 108 denotes a gas inlet valve.

Numeral 109 denotes a target, 110 denotes a sputtering electrode, 111 denotes a power supply for discharge, and 112 denotes a magnet, which is arranged at the rear surface side of the target 109. Numeral 113 denotes a substrate holder disposed within the vacuum vessel 101 so as to be opposed to the front surface of the target 109, and a substrate 114 for depositing a thin film is set on the substrate holder 113. The object denoted by 118 is an insulator.

With respect to the sputtering system constructed as shown above, its operation is described below. First, the interior of the vacuum vessel 101 is evacuated to about $10^{-7}$ Torr through the evacuation port 102 by the vacuum pump. Next, the discharge gas 107 is introduced into the vacuum vessel 101 via the gas inlet tube 105 connected to one end of the vacuum vessel 101, so that the internal pressure of the vacuum vessel 101 is maintained at about $10^{-3}$ to $10^{-2}$ Torr. In this state, power is supplied from the DC or high-frequency discharge power supply 111 to the sputtering electrode 110 to which the target 109 is mounted, so that an electric field is formed. As a result, by the action of the electric field in combination with a magnetic field due to the magnet 112 set on the rear side of the target 109, ring-shaped plasma due to discharge occurs near the surface of the target 109, giving rise to a sputtering phenomenon. Thus, by sputtered particles emitted from the target 109, a thin film is deposited on the substrate 114 set on the substrate holder 113.

In recent years, as the thin film material progressively advances to higher functions, there is a growing need for film deposition under low gas pressure. In the case of film deposition under about $10^{-3}$ Torr or lower pressure, the above magnetron sputtering system would be problematic in discharge stability, so would be substantially difficult to achieve the film deposition.

Therefore, as described in Japanese Laid-open Patent Publication No. 6-041739, there has been an attempt made in which a helical coil connected to a high-frequency power supply is provided between a substrate and a target of the magnetron sputtering system so as to stabilize the discharge under low g as pressure. The coil generates an inductive magnetic field when high-frequency power is applied thereto. FIG. 8 shows a schematic construction of a magnetron sputtering system in which this helical coil is additionally provided. Referring to FIG. 8, numeral 121 denotes the helical coil. Numeral 122 denotes a coil-use high-frequency power supply connected to the helical coil 121. T his magnetron sputtering system operates generally in the same way as the foregoing magnetron sputtering system, but differs therefrom in that power is supplied to the sputtering electrode 110 while high-frequency power is supplied to the helical coil 121 with the coil-use high-frequency power supply 122.

As to dry etching systems, on the other hand, there have been devised some forms of discharge suitable for discharge at low gas pressure by other methods. As an example, the present applicant has previously proposed a dry etching system. In this dry etching system, as shown in FIG. 9, with a flat type antenna 131 disposed outside a vacuum vessel 101, a high-frequency power of about 50 MHz–3 GHz is applied to this flat type antenna 131 with a high-frequency power supply 135, and an electromagnetic wave generated by the flat type antenna 131 is introduced into the vacuum vessel 101 through an electromagnetic-wave inlet window 134. Also, high-frequency power is supplied from a high-frequency power supply 132 to the substrate 114, and etching gas 133 is introduced into the vacuum vessel 101 through the gas inlet tube 105, by which plasma is formed inside the vacuum vessel 101 under low gas pressure.

However, with such a constitution as shown in FIG. 8, since the helical coil 121 is set in the vacuum vessel 101, the coil material is sputtered to form in-film impurities. Also, if the coil material is prevented from being sputtered, film would be deposited on the coil, resulting in an unstable plasma. This would make a dust generating source or cause the issue of unstable plasma, disadvantageously.

Also, with such a constitution as shown in FIG. 9, in applications to a sputtering system, especially when an electrical conductor film is formed, there would occur an issue unique to a film deposition system such as a sputtering system in which the conductor film would be deposited onto the electromagnetic-wave inlet window 134, so that electromagnetic waves could no longer be radiated into the vacuum vessel 101.

In view of these issues of the prior art, an object of the present invention is to provide a sputtering system which is capable of maintaining discharge stably even under low gas pressure and thus forming a high-quality film.

SUMMARY OF THE INVENTION

In accomplishing these and other aspects, according to a first aspect of the present invention, there is provided a sputtering system comprising: a vacuum chamber; and a sputtering electrode provided in the vacuum chamber. A target is supported on the sputtering electrode with a front surface of both the target and a substrate disposed in the vacuum chamber arranged so as to be opposed to each other. In addition, a high-frequency or DC power source is provided for supplying a high-frequency or DC power to the sputtering electrode to generate plasma on the target, and an antenna is provided for generating an electromagnetic wave which is provided outside the vacuum chamber and near the target. Finally, an electromagnetic-wave inlet window is provided for introducing into the vacuum chamber an electromagnetic wave generated from the antenna which is provided in a wall of the vacuum chamber.

Thus, the sputtering system is capable of maintaining discharge stably, and so forming a high quality film, even under low gas pressure by introducing into the vacuum chamber the electromagnetic wave derived from the antenna without causing occurrence of impurities by the antenna being sputtered or causing unstable plasma due to film deposition.

According to a second aspect of the present invention, there is provided a sputtering system according to the first aspect, wherein the electromagnetic-wave inlet window is disposed on a side and rear of the target in the wall of the vacuum chamber. Thereby, the amount of film deposition onto the inner surface of the electromagnetic-wave inlet window can be lessened, and a stable film deposition can be achieved even during a continuous use.

According to a third aspect of the present invention, there is provided a sputtering system according to the first or second aspect, wherein the electromagnetic-wave inlet window is made of an insulator. Thus, since the electromagnetic-wave inlet window can electrically insulate the sputtering electrode and the vacuum chamber from each other, there is no need for providing the electromagnetic-wave inlet window implemented for introduction of an electromagnetic wave, and film deposition onto the insulator that would obstruct the introduction of an electromagnetic wave can substantially be eliminated.

According to a fourth aspect of the present invention, there is provided a sputtering system according to any one of the first to third aspect, wherein the vacuum chamber, an electromagnetic-wave transmission path comprising a space that does not maintain discharge is provided so as to range from the electromagnetic-wave inlet window to near the front surface of the target. Thus, even if the electromagnetic-wave inlet window is provided rearward, that is, on a side and rear of the target in the wall of the vacuum chamber, the electromagnetic wave can be transmitted securely to the vicinity of the target through the electromagnetic-wave transmission path, and plasma does not occur in the electromagnetic-wave transmission path so that film deposition on the electromagnetic-wave inlet window can substantially be eliminated. Thus, continuous film deposition can be achieved without replacing or cleaning the electromagnetic-wave inlet window.

According to a fifth aspect of the present invention, there is provided a sputtering system according to the fourth aspect, wherein the space of the electromagnetic-wave transmission path is a gap of 1 mm–5 mm.

According to a sixth aspect of the present invention, there is provided a sputtering system according to any one of the first to third aspects, further comprising a ground shield provided on a side and rear of the target. The ground shield and a side surface of the target define an electromagnetic-wave transmission path ranging from the electromagnetic-wave inlet window to a vicinity of a surface of the target surface opposite to the substrate formed by a space which does not maintain discharge.

According to a seventh aspect of the present invention, there is provided a sputtering system according to the sixth aspect, wherein the gap between the side surface of the target and the ground shield is set to 1 mm –5 mm.

According to an eighth aspect of the present invention, there is provided a sputtering system according to any one of the first to seventh aspects, wherein a magnet for forming a magnetic field gradient from the electromagnetic-wave inlet window toward the target is set outside the vacuum chamber so as to introduce the electromagnetic wave radiated from the electromagnetic-wave inlet window to the vicinity of the target by action of a magnetic field having the magnetic field gradient. Thus, the electromagnetic wave can be led to the vicinity of the target efficiently by action of the magnetic field having the magnetic field gradient. As a result, the electromagnetic wave efficiently acts upon the plasma generated on the target so that the discharge gas pressure can be further lowered.

According to a ninth aspect of the present invention, there is provided a sputtering system according to the eighth aspect, wherein the magnet is an electromagnetic set outside the vacuum chamber.

According to a tenth aspect of the present invention, there is provided a sputtering system according to the eighth aspect, wherein the magnet is a permanent magnet set outside the vacuum chamber.

According to an 11th aspect of the present invention, there is provided a sputtering system according to any one of the first to eighth aspects, wherein a sputtering-use magnetic circuit for generating a magnetic field that causes plasma to be trapped on the target is provided in the vicinity of the target.

Thus, as in the foregoing cases, a high-quality film deposition can be achieved even during low gas pressures. In addition, due to the magnetic field generated by sputtering-use magnetic circuit, plasma generated on the target is trapped on the target by a combination of the magnetic field and a negative potential developed at the sputtering electrodes. Therefore, the plasma density is improved, and the introduced electromagnetic wave can be led onto the target efficiently. As a result, the discharge gas pressure can be further lowered.

According to a 12th aspect of the present invention, there is provided a sputtering system according to the 11th aspect, wherein the sputtering-us magnetic circuit is provided on the front surface side of the target.

According to a 13th aspect of the present invention, there is provided a sputtering system according to the 11th aspect, wherein the sputtering-use magnetic circuit is provided on a rear surface side of the target.

According to a 14th aspect of the present invention, there is provided a sputtering system according to any one of the first to 13th aspects, wherein a high-frequency power of a 50 MHz–3 GHz frequency is supplied to the antenna set outside the vacuum chamber. As a result, the high-frequency or DC power is supplied to the target while an electromagnetic wave is radiated into the vacuum chamber via the electromagnetic-wave inlet window provided on the side and rear of the target in the wall of the vacuum chamber.

Thus, the sputtering system is capable of maintaining discharge stably, and so forming a high quality film, even under low gas pressure. In addition the electromagnetic-wave inlet window is provided on the side and rear of the target in the wall of the vacuum chamber. Thus, the amount of film deposition on the inner surface of the electromagnetic-wave inlet window can be lessened, and stable film deposition can be achieved even during continuous use.

According to a 15th aspect of the present invention, there is provided a sputtering system according to any one of the first to 14th aspects, wherein the antenna is a spiral-shaped antenna.

According to a 16th aspect of the present invention, there is provided a sputtering system according to any one of the first to 14th aspects, wherein the antenna is a flat-shaped antenna.

According to a 17th aspect of the present invention, there is provided a sputtering system according to any one of the first to 16th aspects, wherein the target is a material of an electrical conductor to be formed on the substrate.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
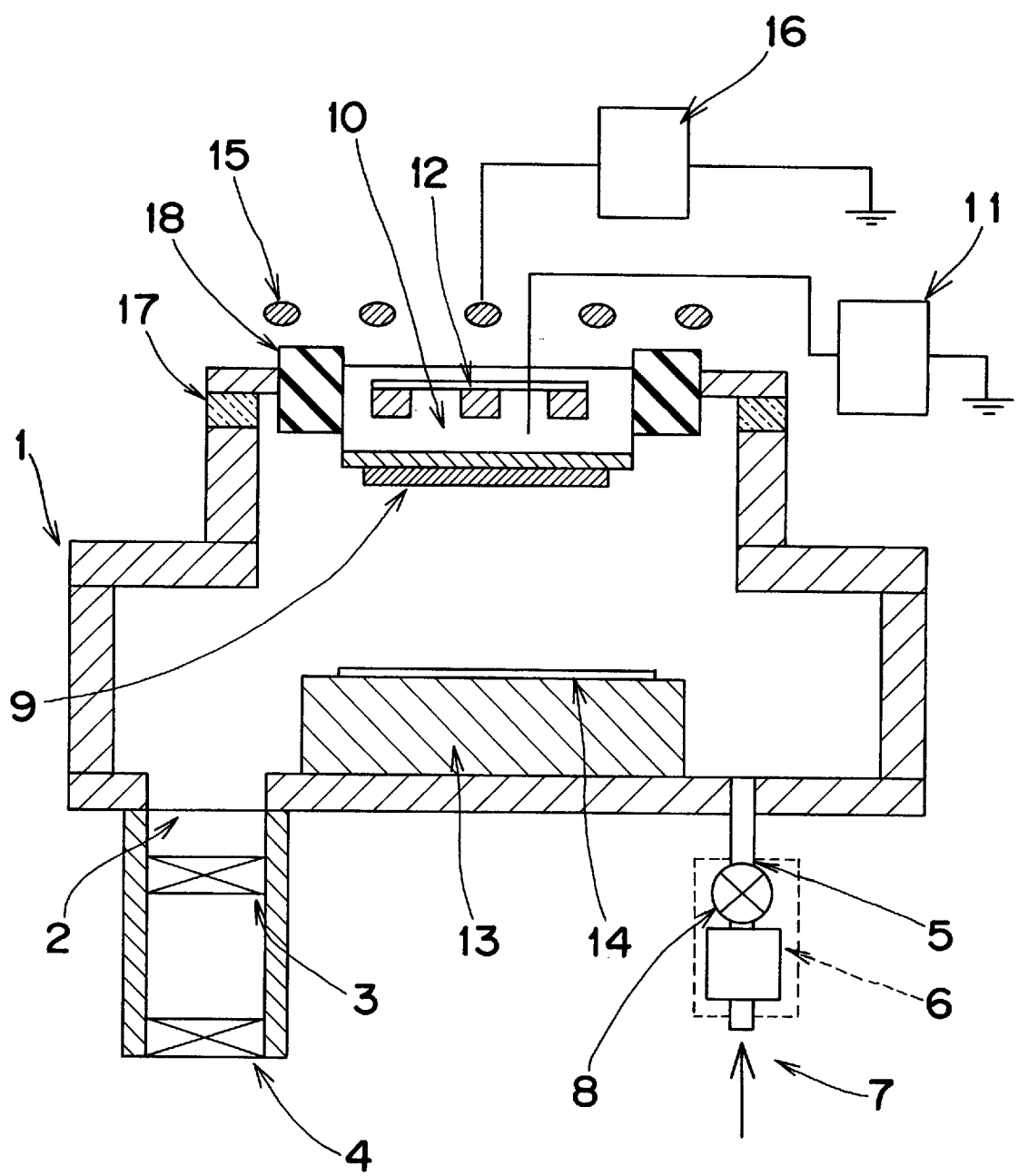
FIG. 1 is a longitudinal sectional view showing a schematic c construction of a sputtering system according to a first embodiment of the present invention.

Before the description of the present invention proceeds, it is to be noted that like parts are designated by like reference numerals throughout the accompanying drawings.

Hereinbelow, embodiments of the sputtering system of the present invention are described with reference to FIGS. 1 to 6.

(First Embodiment)

Figure 10:
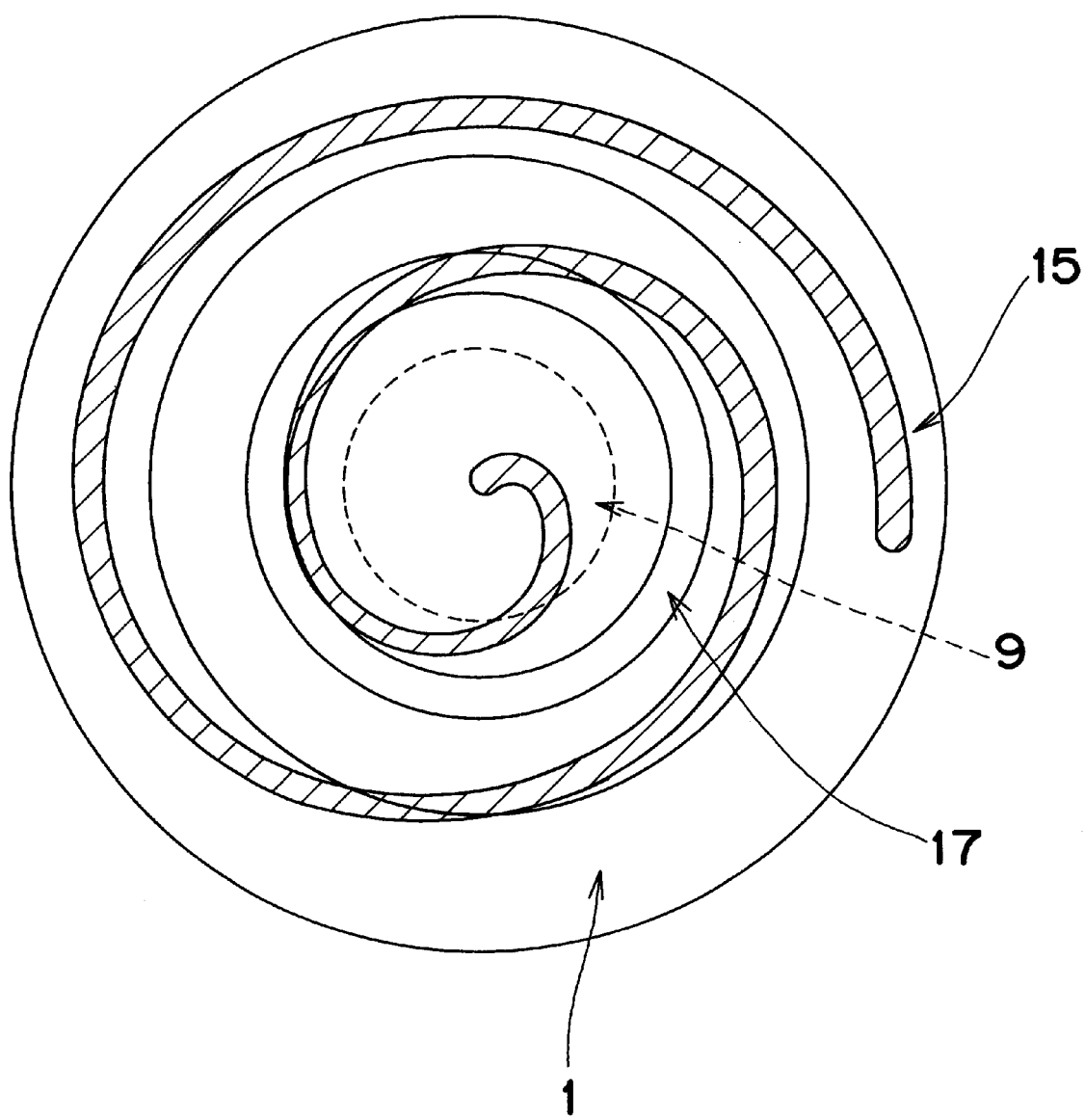
FIG. 10 is a schematic plan view of the sputtering system of FIG. 1.

A sputtering system of a first embodiment of the present invention is described with reference to FIGS. 1 and 10. FIG. 1 is a longitudinal sectional view showing a schematic construction of the sputtering system according to the first embodiment of the present invention. FIG. 10 is a schematic plan view of the sputtering system of FIG. 1. Referring to FIGS. 1 and 10, reference numeral 1 denotes a vacuum chamber, for example, which is earthed, 2 denotes an evacuation port, which is provided in the vacuum chamber 1 and which communicates with a vacuum pump (not shown), and 3 denotes a movable valve, which allows discharge conductance to be controlled. Denoted by numeral 4 is a main valve for opening and closing the evacuation port 2.

Numeral 5 denotes a gas inlet tube directed toward the inside of the vacuum chamber 1, and 6 denotes a gas flow rate controller attached to the gas inlet tube 5. Numeral 7 denotes discharge gas, which is introduced into the vacuum chamber 1 through the gas inlet tube 5, and argon gas is normally used. Numeral 8 denotes a gas inlet valve.

Numeral 9 denotes a target set in the vacuum chamber 1, and 10 denotes a sputtering electrode mounted on one side wall, such as a ceiling wall, of the vacuum chamber 1 via an insulator 18, the sputtering electrode 10 serving to support the target 9. Number 11 denotes a discharge-use power supply for applying a negative voltage or a high-frequency voltage to the sputtering electrode 10, and 12 denotes a magnet comprising a permanent magnet or an electromagnet, which is set at the side and toward the rear of the target 9 in the wall of the vacuum chamber 1. Numeral 13 denotes a substrate holder disposed at such a position within the vacuum chamber 1 as to be opposed to the front surface of the target 9. Numeral 14 denotes a substrate which is held by the substrate holder 13 and on which a thin film is to be formed. Further, numeral 15 denotes an antenna (specifically, a spiral-shaped antenna) which is disposed outside the vacuum chamber 1. The antenna discharges electromagnetic waves when high-frequency power is applied thereto. Numeral 16 denotes an antenna-use high-frequency power supply, which is connected to the antenna 15. Numeral 17 denotes a ring-shaped electromagnetic-wave inlet window implemented by a dielectric substance such as quartz which is disposed so that an electromagnetic wave derived from the antenna 15 can be introduced into the vacuum chamber 1. The window 17 is disposed rearward of the target 9 opposite to the substrate 14. That is, the electromagnetic-wave inlet window 17 is disposed on the side and the rear side of the target 9 in the wall of the vacuum chamber 1 as shown in FIG. 1.

As one example, the target 9 is made of nickel-iron so as to form a thin film of magnetic material for producing a Giant Magnet Resistance (GMR) element for a magnetic head. As another example, the target 9 is made of alumina or nitrided aluminum.

With respect to the sputtering system constructed as described above, its operation is described below. First, the discharge gas 7 such as argon gas is introduced into the vacuum chamber 1, and the internal pressure of the vacuum chamber 1 is controlled to about 0.5 mTorr by the movable valve 3 and the gas flow rate controller 6. In this state, a high-frequency power of 10 MHz is applied to the antenna 15 by the antenna-use high-frequency power supply 16, so that an electromagnetic wave is radiated into the vacuum chamber 1 via the electromagnetic-wave inlet window 17, by which plasma is generated in the vacuum chamber 1. Next, when a high-frequency power of 13.56 MHz is applied to the sputtering electrode 10 by the discharge-use power supply 11, plasma is generated on the front surface of the target 9 and the target 9 is sputtered, by which a thin film is formed on the substrate 14.

By the above-described constitution, plasma can be formed stably even under low gas pressure of 1 mTorr or lower within the vacuum chamber 1. Thus, in this embodiment, it becomes possible to form a thin film by sputtering under low gas pressure of about 1 mTorr or lower, and a high-quality thin film having a high directivity can be formed.

Also, the electromagnetic-wave inlet window 17 comprising the dielectric substance is disposed on the side and toward the rear of the target 9 in the wall of the vacuum chamber 1. Therefore, the window 17 is positioned rearward of the plasma which is on the front surface of the target 9. Thus, the amount of film deposition on the inner surface of the electromagnetic-wave inlet window 17 can be lessened, and discharge can be produced stably even during continuous use.

In addition, although the frequency of the high-frequency power to be applied to the antenna 15 has been set to 100 MHz in this embodiment, the frequency may be any one within a range from 50 MHz–3 GHz for stable plasma generation.

Although the power to be applied to the sputtering electrode 10 with the discharge-use power supply 11 has been set to a high-frequency power of 13.56 MHz, the power may also be a DC power or a high-frequency power of another frequency.

(Second Embodiment)

Next, a sputtering system of a second embodiment of the present invention is described with reference to FIGS. 2 and 3. It is noted that the same constituent members as those described in the foregoing first embodiment are designated by like reference numerals and omitted in description, and differences only are described. The case is also the same with the following embodiments.

Reference numeral 21 denotes a ground shield, which is equal in electric potential to the wall of the vacuum chamber 1. A gap 22 between the ground shield 21 and the vacuum chamber 1 is set to such a distance that discharge cannot be maintained. In order to maintain the discharge in the gap 22, neutral gas molecules are ionized by electrons generated by the discharge and it is necessary to make the ionizing speed larger than the lost speed of charged particles. The gap 22 that does not serve for discharge herein depends on the internal pressure of the vacuum chamber 1 and the kinds of gas in the vacuum chamber 1. Since the internal pressure of the vacuum chamber 1 is about 0.1 mTorr to several tens mTorr at actual discharge, it is considered that the average free path of electrons at that time is several cm to several hundreds cm and the ionization coefficient is 0.1 or less. Thus, the gap is of about 1 mm–5 mm in this embodiment.

With this constitution, an electromagnetic wave radiated into the vacuum chamber 1 through the electromagnetic-wave inlet window 17 is diffused into the vacuum chamber 1 through the gap 22 used as a transmission path. For this process, since the gap 22 is formed to be about 1 mm–5 mm, the electromagnetic wave can be transmitted.

According to this embodiment, the same effects as in the foregoing first embodiment can be produced. In addition, since the film deposition onto the electromagnetic-wave inlet window 17 can substantially be eliminated, continuous film deposition can be achieved without replacing or cleaning the electromagnetic-wave inlet window 17.

Further, since plasma generation due to the occurrence of discharge at the gap 22 does not occur, the power fed to the antenna 15 can be put into operation for the discharge on the sputtering electrode 10 side with high efficiency.

(Third Embodiment)

Figure 4:
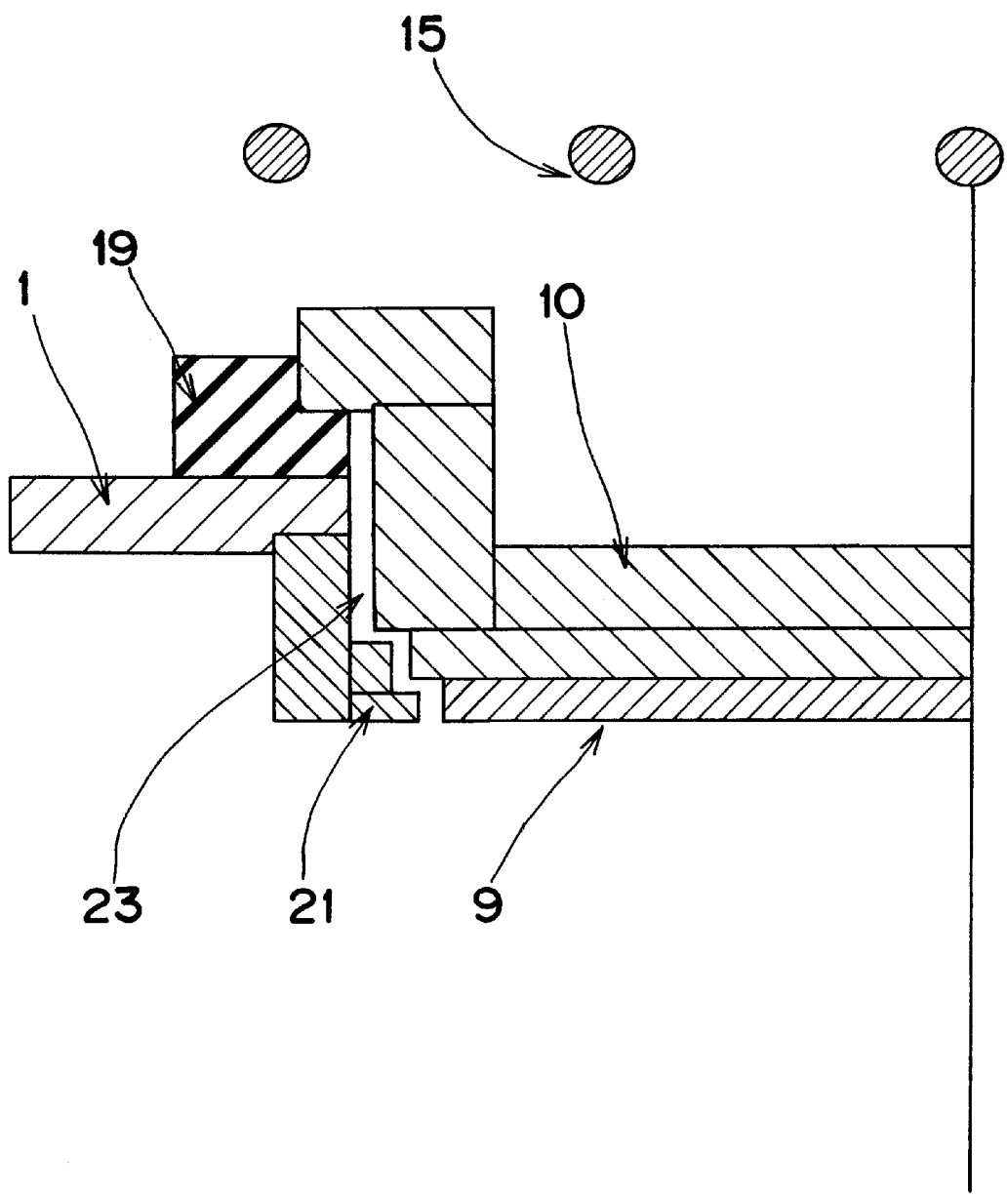
FIG. 4 is a detailed sectional view of and around the sputtering electrode in a sputtering system according to a third embodiment of the present invention.

Next, a sputtering system of a third embodiment of the present invention is described with reference to FIG. 4.

In this embodiment, an electromagnetic-wave inlet window-and-insulator 19 for electrically insulating the sputtering electrode 10 and the vacuum chamber 1 from each other, and for serving as a window through which an electromagnetic wave is introduced into the vacuum chamber 1 is disposed between the vacuum chamber 1 and the sputtering electrode 10. In this case, on one side of the insulator 19 inside the vacuum chamber 1, a gap 23 is formed between the sputtering electrode 10 and the ground shield 21. This gap 23 is generally set to such a gap so that discharge does not occur, i.e., a gap of about 1 mm–5 mm in this embodiment. The insulator 19 may be made of polytetrafluoroethylene (PTFE).

Therefore, an electromagnetic wave radiated from the insulator 19 into the vacuum chamber 1 is spread into the vacuum chamber 1 through the gap 23 used as a transmission path. For this process, since the gap 23 is set to about 1 mm–5 mm, the electromagnetic wave can be transmitted.

By the above-described constitution, in this embodiment, the same effects as in the first or second embodiment can be produced. In addition, there is no need for providing the electromagnetic-wave inlet window 17 implemented by another dielectric substance for introducting of an electromagnetic wave, and film deposition onto the insulator 19 that would obstruct the introduction of an electromagnetic wave can substantially be eliminated. Furthermore, the gap 23 has a stepwise configuration and thus, it is more difficult to deposit a film onto the insulator 19 as compared with the straight path of the gap 22.

(Fourth Embodiment)

Figure 5:
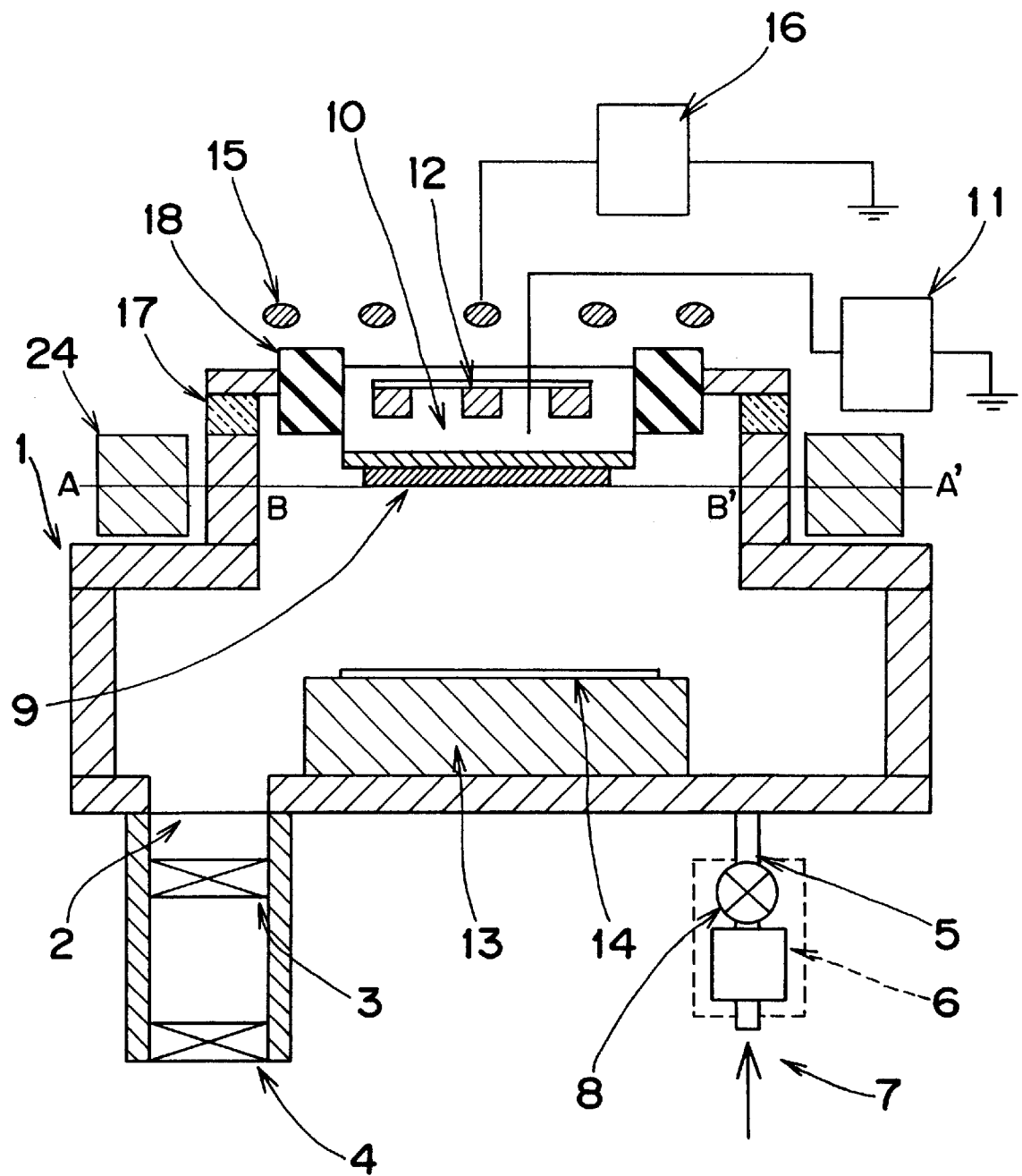
FIG. 5 is a longitudinal sectional view showing a schematic construction of a sputtering system according to a fourth embodiment of the present invention.
Figure 12:
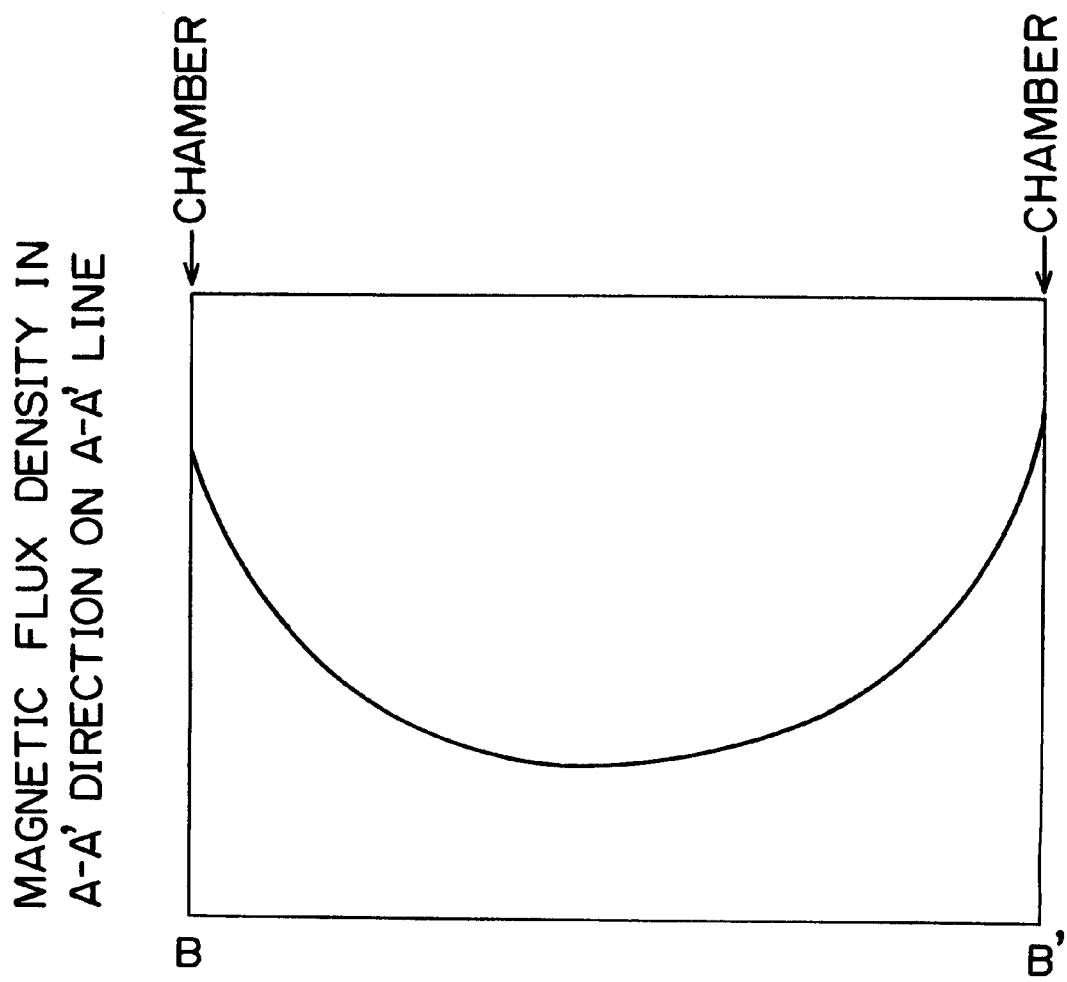
FIG. 12 is a graph showing an example of a magnetic field gradient from the electromagnetic-wave inlet window toward the target on a line A–B–B'–A' in the sputtering system of FIG. 5.

Next, a sputtering system of a fourth embodiment of the present invention is described with reference to FIGS. 5 and 12. FIG. 5 is a longitudinal sectional view showing a schematic construction of the sputtering system according to the fourth embodiment of the present invention. FIG. 12 is a graph showing an example of a magnetic field gradient from the electromagnetic-wave inlet window toward the target on a line A–B–B'–A' in the sputtering system of FIG. 5.

In this embodiment, outside the vacuum chamber 1, a ring-shaped magnet 24 is provided around the target 9. The magnet 24 is placed so that its N pole faces inward. A magnetic field generated in this case is directed inward from the outer wall of the vacuum chamber 1, so that an electromagnetic wave radiated from the electromagnetic-wave inlet window 17 is introduced to the vicinity of the target 9 efficiently by action of the magnetic field. That is, the magnetic field generated in the above case has a magnetic field gradient gradually reducing magnetic forces produced by the magnet 24 as shown in FIG. 12 so as to efficiently introduce the electromagnetic wave radiated through the electromagnetic-wave inlet window 17 to the vicinity of the target 9.

In this embodiment, by the above constitution, the same effects as in the first or second or third embodiment can be produced. In addition, since the electromagnetic wave introduced into the vacuum chamber 1 efficiently acts on the plasma generated on the target 9, the discharge gas pressure can be further lowered.

Although the magnet 24 has been set outside the vacuum chamber 1 in this embodiment, the magnet 24 may also be set inside the vacuum chamber 1.

Further, the magnet 24 has been set in polarity so that the N pole faces inwardly. However, even if the S pole faces inwardly, the same effects can be obtained as a matter of course.

(Fifth Embodiment)

Figure 6:
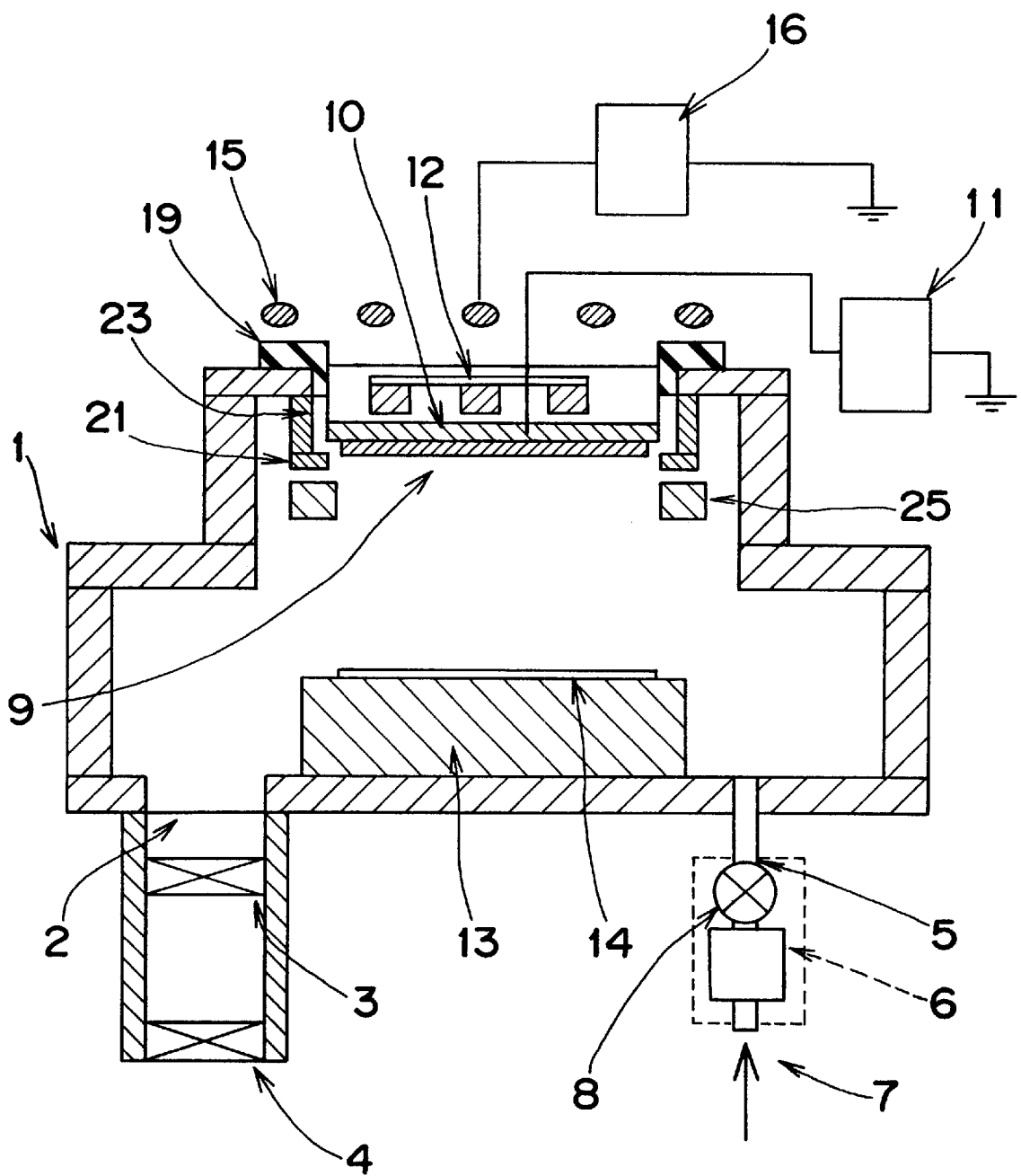
FIG. 6 is a longitudinal sectional view showing a schematic construction of a sputtering system according to a fifth embodiment of the present invention.
Figure 7:
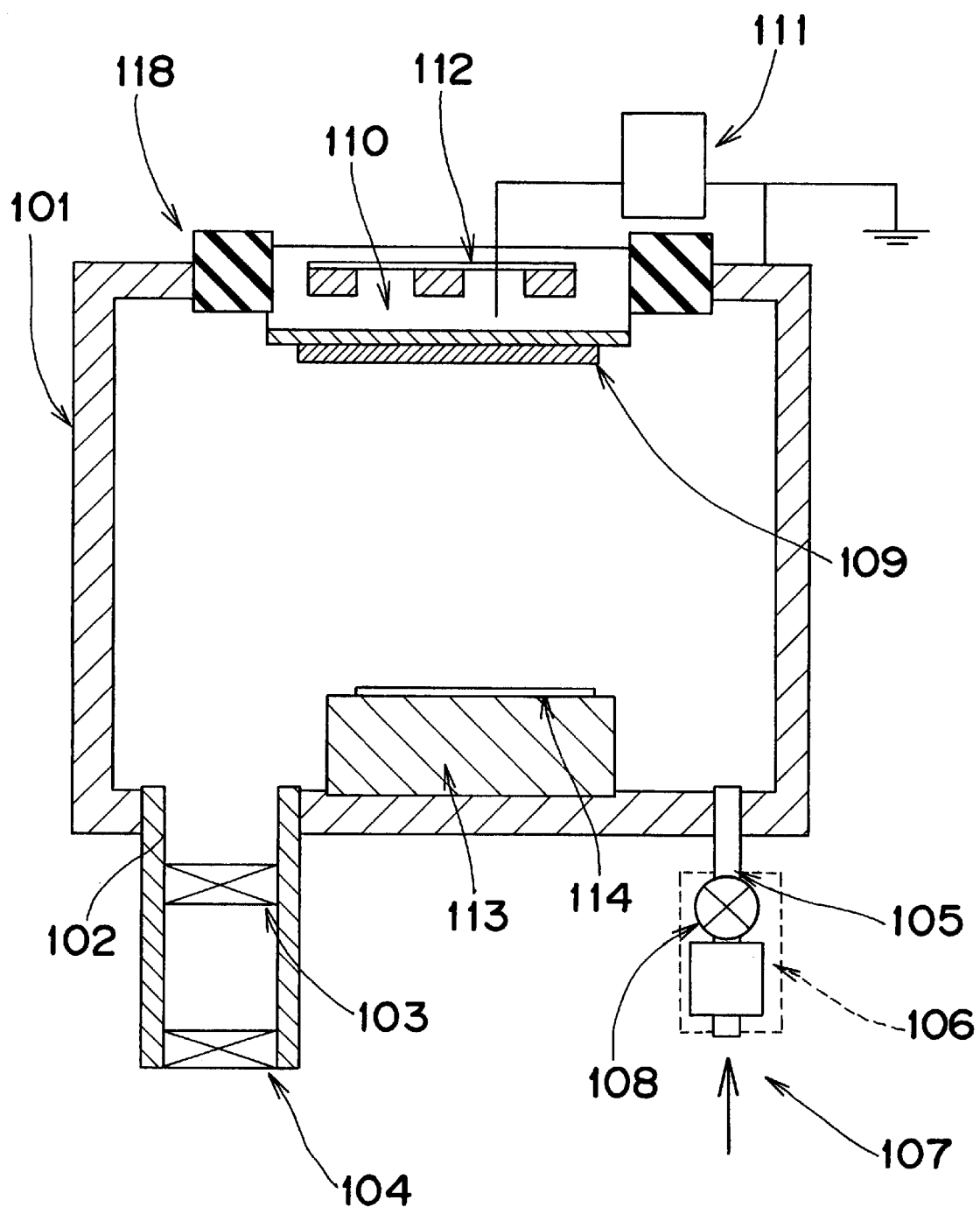
FIG. 7 is a longitudinal sectional view showing a schematic construction of a sputtering system which is an example of the prior art.
Figure 8:
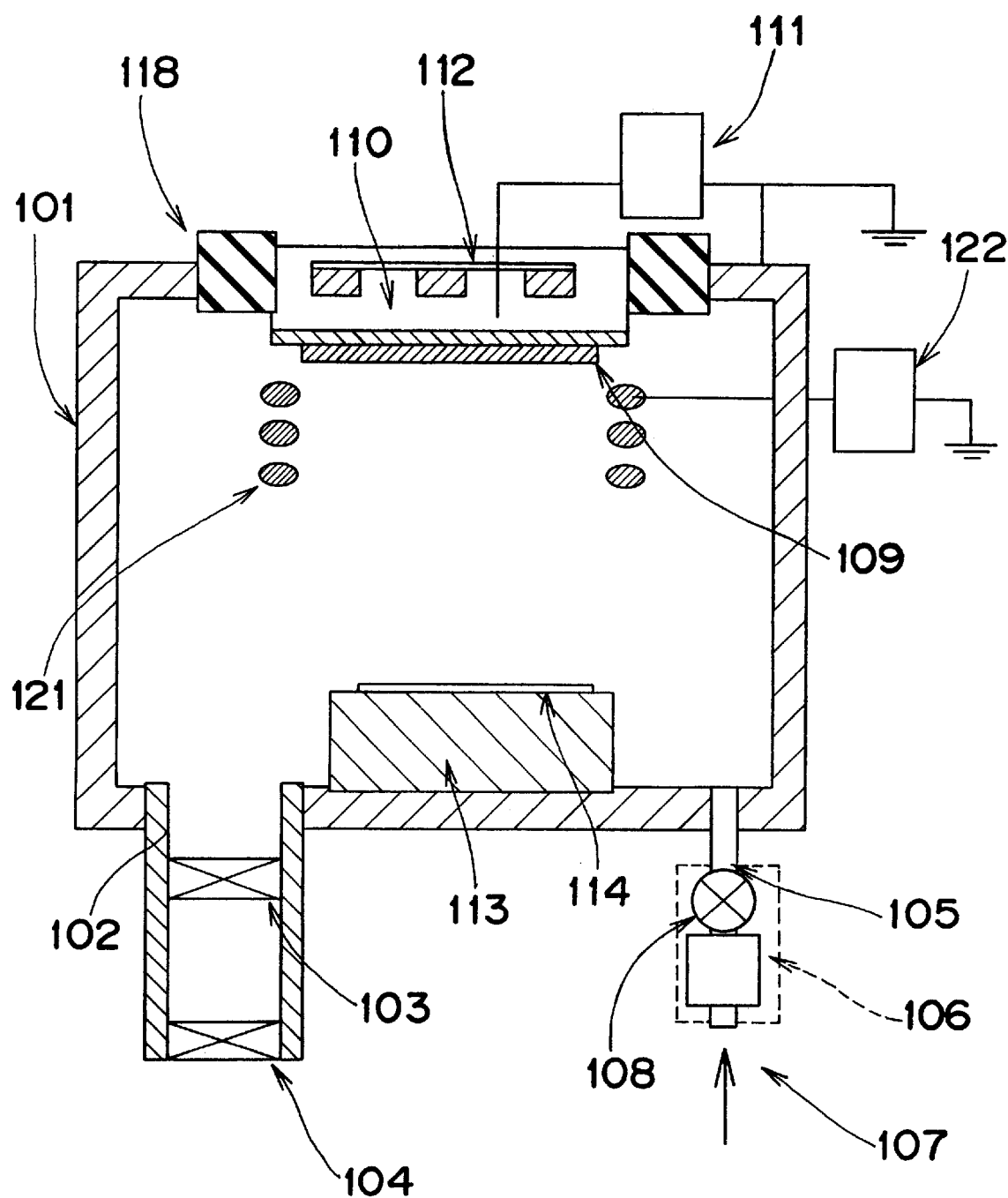
FIG. 8 is a longitudinal sectional view showing a schematic construction of a sputtering system which is another example of the prior art.
Figure 9:
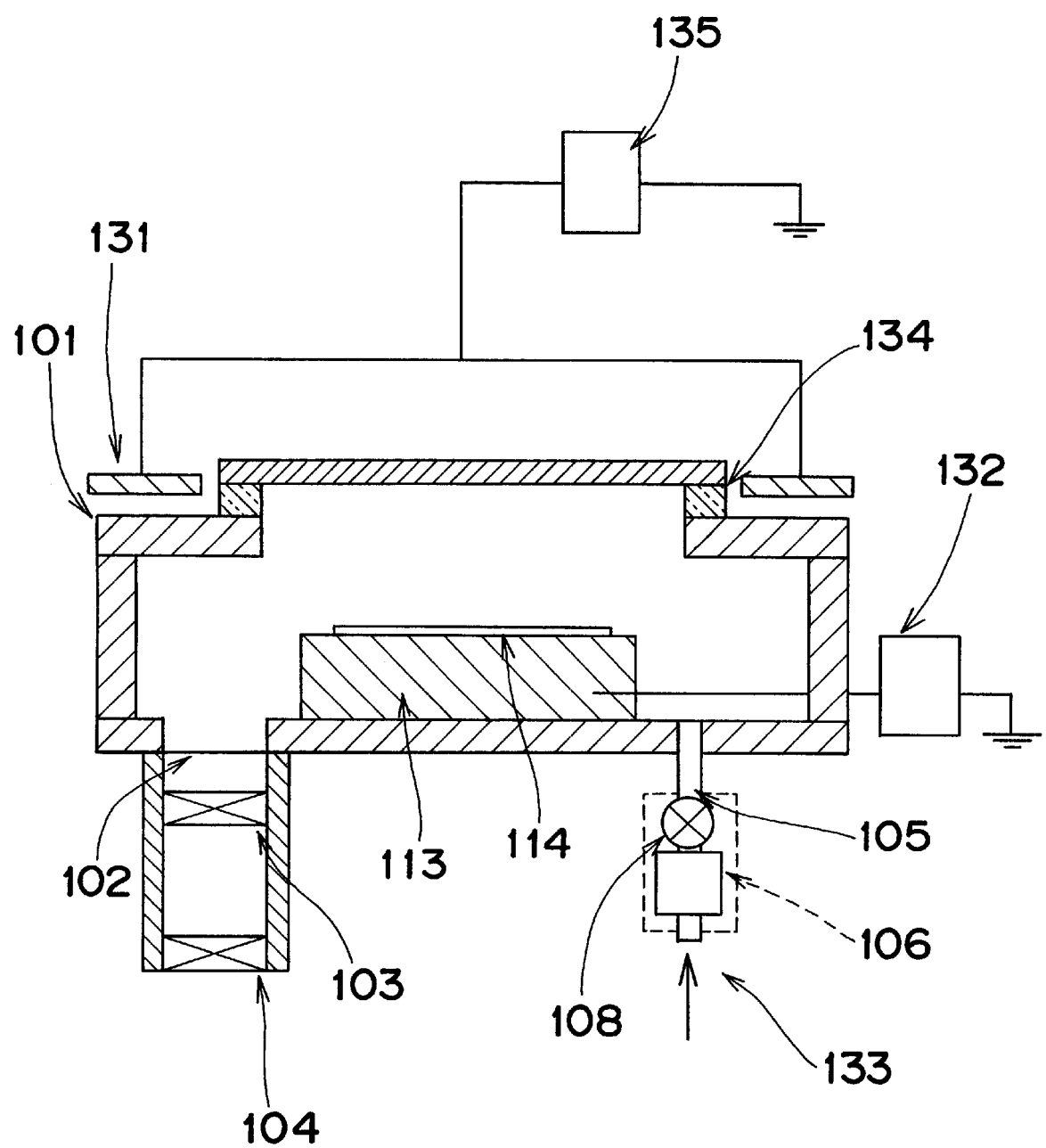
FIG. 9 is a longitudinal sectional view showing a schematic construction of a dry etching system which is another example of the prior art.

Next, a sputtering system of a fifth embodiment of the present invention is described with-reference to FIG. 6.

In this embodiment, a magnetic circuit 25 for sputtering is set around the target 9. By a magnetic field generated by the sputtering-use magnetic circuit 25, plasma generated on the target 9 is trapped on the target 9 by action of a combination of the magnetic circuit 25 and a negative potential developed to the sputtering electrode 10, so that plasma density is improved. Also, the electromagnetic wave introduced from the insulator 19 is led onto the target 9 efficiently by the action of the sputtering-use magnetic circuit 25.

In this embodiment, by the above constitution, the same effects as in the third or fourth embodiment can be produced. In addition, since the density of plasma generated on the target 9 is improved and since the electromagnetic wave introduced into the vacuum chamber 1 efficiently acts on the plasma generated on the target 9, the discharge gas pressure can be further lowered.

Although the sputtering-use magnetic circuit 25 has been set on the front surface side of the target 9 in this embodiment, the magnetic circuit 25 may also be set on the rear surface side of the target 9.

In each of the embodiments, although a spiral-shaped antenna 15 has been shown as an example, a flat type antenna may also be used.

Figure 2:
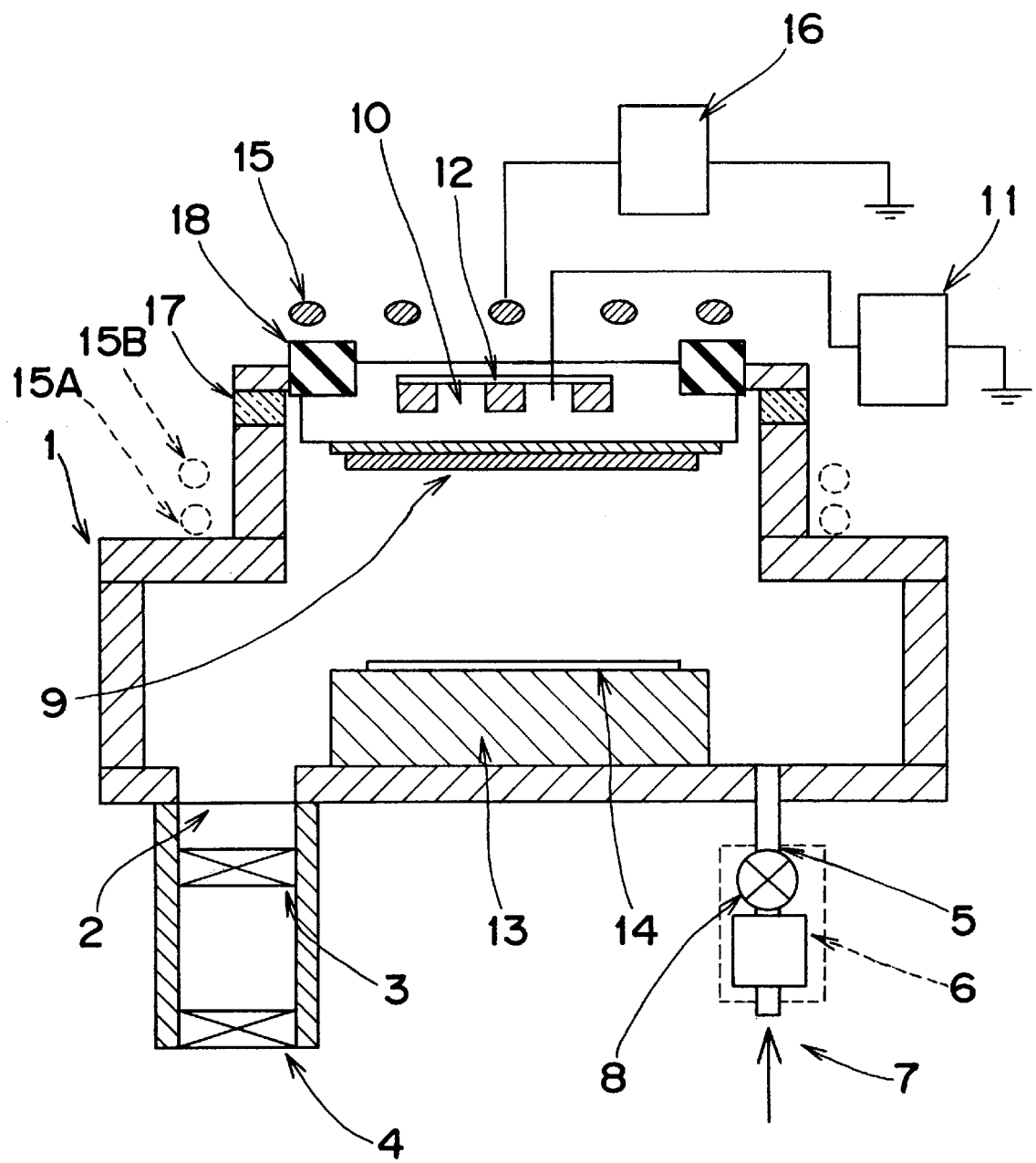
FIG. 2 is a longitudinal sectional view showing a schematic construction of a sputtering system according to a second embodiment of the present invention.
Figure 3:
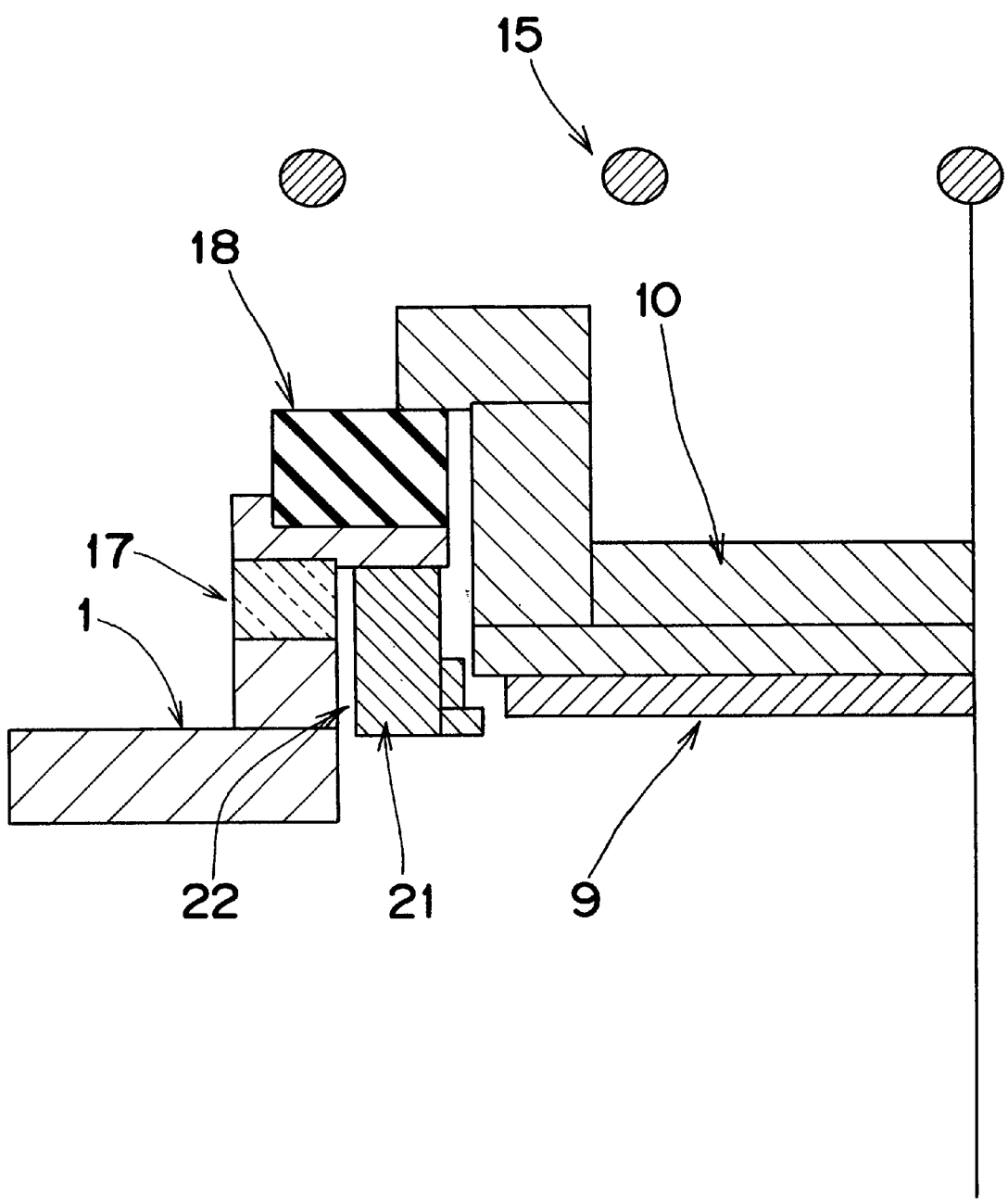
FIG. 3 is a detailed sectional view of and around the sputtering electrode in the same embodiment.

In addition, the antenna 15 may be located at the side of the target 9 and outside of the vacuum chamber 1 at either one of positions 15A and 15B shown by dotted lines in FIG. 2.

Figure 11:
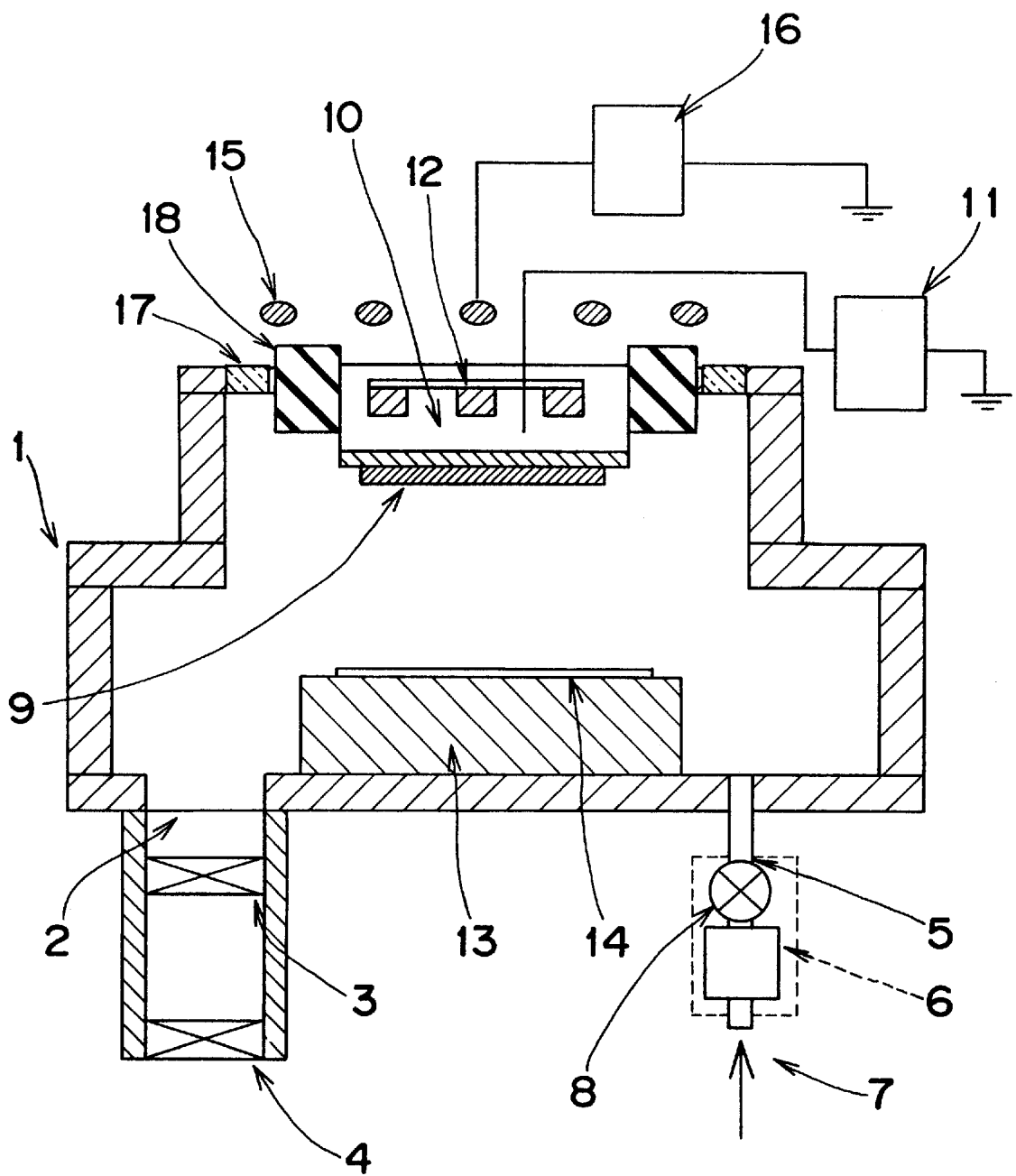
FIG. 11 is a longitudinal sectional view showing a schematic construction of a sputtering system according to a modification of the first embodiment.

In the first embodiment, the window 17 may also be located at the upper wall of the vacuum chamber 1 as shown in FIG. 11 which is on the side and rear of the target 9, although the window 17 is located at the side wall of the vacuum chamber 1 as shown in FIG. 1 which is on the side and rear of the target 9.

According to the sputtering system of the present invention, as described above, there can be obtained advantages that discharge can be maintained stably even under low gas pressures of 1 mTorr or lower, and that a high-quality film can be formed. Especially, when the frequency is any one within a range from 50 MHz–3 GHz, the discharge may be started under low gas pressures and thus, stable plasma may be generated. Specifically, when the frequency is any one within a range from 50 MHz–300 MHz, the effect can be remarkably performed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A sputtering device comprising:
    a vacuum chamber;
    a sputtering electrode for supporting a target, said sputtering electrode being arranged in said vacuum chamber such that a front surface of the target to be supported by said sputtering electrode opposes a substrate disposed in said vacuum chamber;
    a power source connected to said sputtering electrode for supplying one of a high-frequency power and a DC power to said sputtering electrode so as to generate plasma at the target;
    an antenna for generating an electromagnetic wave, said antenna being positioned outside said vacuum chamber and near said sputtering electrode so as to oppose a rear surface of the target to be supported by said sputtering electrode;
    an electromagnetic-wave inlet window for introducing the electromagnetic wave generated by said antenna into said vacuum chamber, said electromagnetic-wave inlet window being arranged in a wall of said vacuum chamber at a rear surface side of the target to be supported by said sputtering electrode and outside of a peripheral edge of the target with respect to a center of the target.

2. The sputtering device of claim 1, wherein said electromagnetic-wave inlet window is formed of an insulating material.

3. The sputtering device of claim 1, wherein an electromagnetic-wave transmission path is formed in said vacuum chamber, said electromagnetic-wave transmission path extending from said electromagnetic-wave inlet window to a position near the front surface of the target to be supported by said sputtering electrode, said electromagnetic-wave transmission path being formed such that discharge is not maintained therein.

4. The sputtering device of claim 3, wherein said electromagnetic-wave transmission path comprises a gap having a width of 1 mm–5 mm.

5. The sputtering device of claim 1, further comprising a ground shield located at a side of a rear surface of the target to be supported by said sputtering device, said ground shield and a side surface of the target defining an electromagnetic-wave transmission path extending from said electromagnetic-wave inlet window to a position near the front surface of the target, said electromagnetic-wave transmission path being formed such that discharge is not maintained therein.

6. The sputtering device of claim 5, wherein said electromagnetic-wave transmission path comprises a gap between said ground shield and the side surface of the target, said gap having a width of 1 mm–5 mm.

7. The sputtering device of claim 1, further comprising a magnet for generating a magnetic field gradient from said electromagnetic-wave inlet window to the target, said magnet being arranged outside said vacuum chamber so as to direct the electromagnetic wave introduced through said electromagnetic-wave inlet window to a position near the target by generating a magnetic field having the magnetic field gradient.

8. The sputtering device of claim 7, wherein said magnet comprises an electromagnet positioned outside said vacuum chamber.

9. The sputtering device of claim 7, wherein said magnet comprises a permanent magnet positioned outside said vacuum chamber.

10. The sputtering device of claim 1, further comprising a sputtering-use magnetic circuit for generating a magnetic field to trap the plasma at the target, said sputtering-use magnetic circuit being located at the target.

11. The sputtering device of claim 10, wherein said sputtering-use magnetic circuit is located at a side of the front surface of the target.

12. The sputtering device of claim 10, wherein said sputtering-use magnetic circuit is located at a side of a rear surface of the target.

13. The sputtering device of claim 1, further comprising an antenna power source connected to said antenna for supplying a high-frequency power of 50 MHz–3 GHz frequency to said antenna for generation of the electromagnetic wave to be introduced into said vacuum chamber through said electromagnetic-wave inlet window.

14. The sputtering device of claim 1, wherein said antenna comprises a spiral-shaped antenna.

15. The sputtering device of claim 1, wherein said antenna comprises a flat-shaped antenna.

16. The sputtering device of claim 1, further comprising a target supported by said sputtering electrode, said target comprising an electrical conductor material to be formed on the substrate.

17. The sputtering device of claim 1, further comprising a ground shield between a side of the target to be supported by said sputtering device and a side wall of said vacuum chamber, said ground shield and said side wall of said vacuum chamber defining an electromagnetic-wave transmission path extending from said electromagnetic-wave inlet window to a position near the front surface of the target, said electromagnetic-wave transmission path being formed such that discharge is not maintained therein.

18. The sputtering device of claim 17, wherein said electromagnetic-wave transmission path comprises a gap between said ground shield and said side wall of said vacuum chamber, said gap having a width of 1 mm–5 mm.

* * * * *